US010276556B2

(12) United States Patent
Agam et al.

(10) Patent No.: US 10,276,556 B2
(45) Date of Patent: *Apr. 30, 2019

(54) SEMICONDUCTOR DEVICE HAVING BIASING STRUCTURE FOR SELF-ISOLATING BURIED LAYER AND METHOD THEREFOR

(71) Applicant: SEMICONDUCTOR COMPONENTS INDUSTRIES, LLC, Phoenix, AZ (US)

(72) Inventors: Moshe Agam, Portland, OR (US); Johan Camiel Julia Janssens, Asse (BE); Bruce Greenwood, Gresham, OR (US); Sallie Hose, Gresham, OR (US); Agajan Suwhanov, Portland, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/004,718

(22) Filed: Jun. 11, 2018

(65) Prior Publication Data
US 2018/0315747 A1 Nov. 1, 2018

Related U.S. Application Data

(63) Continuation of application No. 15/497,443, filed on Apr. 26, 2017, now Pat. No. 10,026,728.

(51) Int. Cl.
*H01L 29/06* (2006.01)
*H01L 27/02* (2006.01)
(Continued)

(52) U.S. Cl.
CPC ........ *H01L 27/0259* (2013.01); *H01L 21/265* (2013.01); *H01L 21/76224* (2013.01);
(Continued)

(58) Field of Classification Search
CPC ... H01L 29/06; H01L 29/064; H01L 29/0649; H01L 29/36; H01L 29/66; H01L 29/663;
(Continued)

(56) References Cited

U.S. PATENT DOCUMENTS 7,095,092 B2 8/2006 Zhu et al.
7,989,875 B2 8/2011 Noort et al.
(Continued)

OTHER PUBLICATIONS

Lijuan et al., A high voltage SOI pLDMOS with a partial interface equipotential floating buried layer, Journal of Semiconductors, Jul. 2013, 074009-1 thru 074009-5, vol. 34, No. 7.
(Continued)

*Primary Examiner* — Monica D Harrison
(74) *Attorney, Agent, or Firm* — Kevin B. Jackson

(57) ABSTRACT

A semiconductor device includes a floating buried doped region, a first doped region disposed between the floating buried doped region and a first major surface, and a semiconductor region disposed between the floating buried doped region and a second major surface. Trench isolation portions extend from the first major surface and terminate within the semiconductor region to define an active region. An insulated trench structure is laterally disposed between the trench isolation portions, terminates within the floating buried doped region, and defines a first portion and a second portion of the active region. A biasing semiconductor device is within the first portion, and a functional semiconductor device is within the second portion. The biasing semiconductor device is adapted to set a potential of the floating buried doped region and adapted to divert parasitic currents away from the functional semiconductor device.

20 Claims, 8 Drawing Sheets

(51) Int. Cl.
*H01L 21/76* (2006.01)
*H01L 23/535* (2006.01)
*H01L 29/36* (2006.01)
*H01L 29/66* (2006.01)
*H01L 29/739* (2006.01)
*H01L 21/762* (2006.01)
*H01L 21/265* (2006.01)

(52) U.S. Cl.
CPC .......... *H01L 23/535* (2013.01); *H01L 27/027* (2013.01); *H01L 29/0649* (2013.01); *H01L 29/36* (2013.01); *H01L 29/66333* (2013.01); *H01L 29/7396* (2013.01)

(58) Field of Classification Search
CPC ............ H01L 29/6633; H01L 29/66333; H01L 29/73; H01L 29/739; H01L 29/7396; H01L 27/02; H01L 27/25; H01L 27/0259; H01L 27/027; H01L 21/26; H01L 21/265; H01L 21/76; H01L 21/762; H01L 21/7622; H01L 21/76224
USPC ........................................................ 257/140
See application file for complete search history.

(56) References Cited

U.S. PATENT DOCUMENTS

| | | |
|---|---|---|
| 8,138,531 B2 | 3/2012 | Adkisson et al. |
| 8,264,038 B2 | 9/2012 | Pendharkar et al. |
| 8,338,872 B2 | 12/2012 | Khemka et al. |
| 9,082,654 B2 | 7/2015 | Iwamoto et al. |
| 9,166,012 B2 | 10/2015 | Sim et al. |
| 10,026,728 B1* | 7/2018 | Agam ................ H01L 27/0259 |
| 2015/0002967 A1 | 1/2015 | Kawase et al. |

OTHER PUBLICATIONS

Xia et al., A novel partial-SOI LDMOSFET (>800 V) with n-type floating buried layer in substrate, Microelectronics Reliability, 54, 2014, pp. 582-586, www.elsevier.com/locate/microrel.

* cited by examiner

US 10,276,556 B2

SEMICONDUCTOR DEVICE HAVING BIASING STRUCTURE FOR SELF-ISOLATING BURIED LAYER AND METHOD THEREFOR

CROSS-REFERENCE TO RELATED APPLICATIONS

The present application is a continuation application of U.S. patent application Ser. No. 15/497,443, filed on Apr. 26, 2017 and issued as U.S. Pat. No. 10,026,728 on Jul. 17, 2018, which is hereby incorporated by reference, and priority thereto is hereby claimed.

BACKGROUND

The present invention relates, in general, to electronics and, more particularly, to semiconductor device structures and methods of forming semiconductor devices.

Integrated circuits have been classified as analog devices, digital devices, or power devices. Smart Power technologies combine or integrate analog and digital circuits with power devices on or within a single semiconductor substrate. The smart part of the smart power circuit adds, for example, control, diagnostic, and protection functions to the power semiconductor devices. Smart Power technologies have increased the robustness and reliability of power drivers for automotive and industrial applications. Such applications have included, for example, intelligent power switches for controlling an ABS-braking system, system power chips for airbag control, engine management, motor control, switched mode power supplies, intelligent switching of lights, among others.

The integration of logic and analog functions with power transistors on a single semiconductor die presents challenges in the isolation schemes used to physically separate and electrically isolate the different functional devices. Such isolation schemes have included, for example, junction isolation and dielectric isolation schemes. Dielectric isolation schemes have included dielectric trench isolation, which separates components in a lateral direction, but not against the substrate, as well as semiconductor-on-insulator ("SOI") schemes that provide both lateral isolation and vertical substrate isolation. Another isolation scheme has combined dielectric trench isolation with junction isolation regions that have been disposed adjoining the trench isolation regions within the active regions of the device.

However, the above noted isolation schemes have several shortcomings. For example, junction isolation schemes include doped regions that consume lateral space within the semiconductor chip, which results in larger chips sizes being used to ensure sufficient lateral spacing to sustain breakdown characteristics. Also, because of the larger area taken up by junction isolation schemes, junction isolation schemes also tend to exhibit undesirable high capacitance. SOI technologies provide for reduced chips sizes, but have had issues with thermal dissipation, high on-resistance due to larger average junction temperature, less robustness during inductive clamping, and lower energy capability during an electro-static discharge ("ESD") event, among others. In addition, in high voltage SOI technology, the parasitic capacitance per unit area of the top layer towards the underlying substrate often exceeds the capacitance per unit area presented by vertical junction isolation. Additionally, SOI technologies are expensive to manufacture.

Accordingly, it is desirable to have an isolation structure and a method of forming the semiconductor devices using the isolation structure that overcomes the shortcomings of prior isolation techniques set forth previously and that reduces the effects of parasitic currents within the resultant structure. It is also desirable for the method to be cost effective and easy to integrate into pre-existing process flows.

Figure 1:
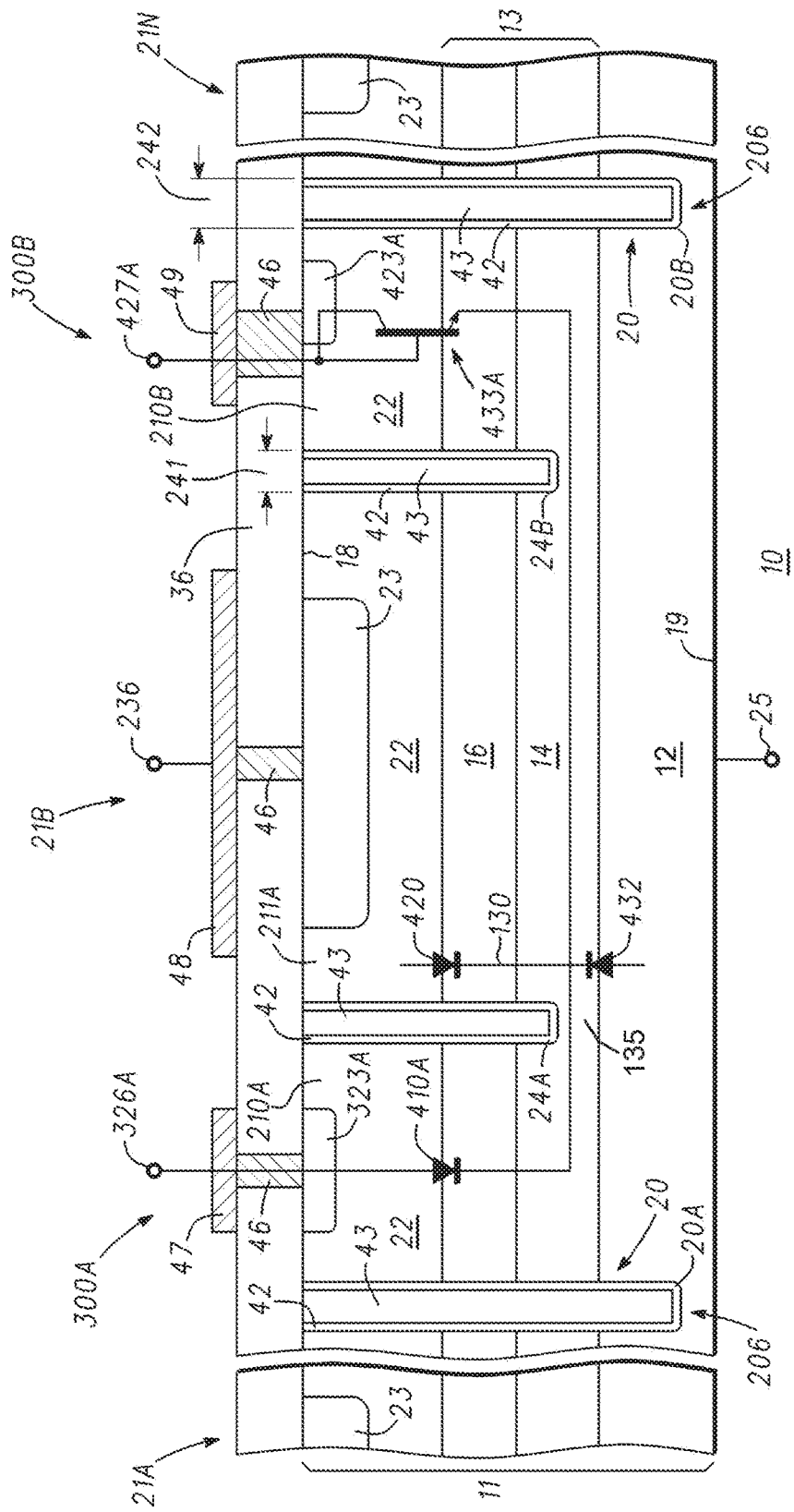
FIG. 1 illustrates an enlarged partial cross-sectional view of one embodiment of a semiconductor device having a floating buried doped region and one or more biasing devices and one or more functional devices in accordance with the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

One solution proposed for solving the above described issues with related devices uses a floating buried structure that adjoined a trench isolation structure within a semiconductor substrate. In this approach, the self-biasing floating buried structure is provided absent any structures that provide direct ohmic or direct low-ohmic electrical contact to it. This approach is further described in co-pending U.S. patent application Ser. No. 15/140,152 filed on Apr. 27, 2016, which has common inventorship, has the same assignee, and is incorporated by reference herein in its entirety. Although this approach beneficially improves, among other things, the use of die area and improved thermal characteristics and electrical characteristics compared to prior structures and methods, in some applications it was found in practice that the potential on the floating buried layer structure could be susceptible to issues associated with parasitic currents injected into the floating buried layer from adjacent regions of the semiconductor substrate. This was found in practice to affect the stability or performance of functional devices within the semiconductor substrate. The present description provides an integrated biasing device structure disposed proximate to one or more functional devices, which is adapted to indirectly set the potential on the floating buried structure. The biasing device structure is further adapted to divert parasitics currents away from the regions where the functional devices are disposed thereby improving the performance and stability of the functional devices that make up an integrated semiconductor device.

The present description includes, among other features, a semiconductor device structure comprising a self-isolating bulk semiconductor substrate. The substrate includes a floating buried doped region of a first conductivity type disposed between a first doped region of a second conductivity type and a semiconductor region of the second conductivity type. The floating buried doped region abuts or adjoins a trench isolation structure that together with the floating buried doped region electrically isolates the doped region. The trench isolation structure defines an active area of the semiconductor device structure. The bulk semiconductor substrate is provided without ohmic or low ohmic contact structures directly physically contacting the floating buried doped region. An insulated trench structure is disposed within the active area and defines a first portion and a second portion of the active area, which are in electrical communication through the floating buried doped region. That is, the first portion and the second portion are not completely electrically isolated from each other by the insulated trench structure. Functional devices are disposed in the second portion of the active area. A separate biasing device is disposed within the first portion of the active area and is adapted to set the potential of the floating buried doped region and to divert parasitic currents away from the functional devices thereby improving the performance of the functional devices.

In one embodiment, a semiconductor device structure comprises a semiconductor substrate having first and second opposing major surfaces. The semiconductor substrate includes a floating buried doped region of a first conductivity type, a first doped region of a second conductivity type disposed between the floating buried doped region and the first major surface, and a semiconductor region of the second conductivity type disposed between the floating buried doped region and the second major surface. A trench isolation structure extends from the first major surface through the first doped region, extends through the floating buried doped region, and extends into the semiconductor region. The floating buried doped region abuts the trench isolation region and the trench isolation defines a perimeter for an active region of the semiconductor device. An insulated trench structure extends from the first major surface through the first doped region and terminates within the floating buried doped region, wherein the insulated trench structure is disposed within the perimeter of the trench isolation structure; the insulated trench structure defines a first portion and a second portion of the active region; and the floating buried doped region electrically couples the first portion and the second portion of the active region together. A first semiconductor device is disposed within the first doped region and within the second portion of the active region. A first conductive electrode is electrically coupled to the first semiconductor device, and a second conductive electrode is electrically coupled to the first portion of the active region, wherein the second conductive electrode, the first portion of the active region, and the floating buried doped region form a bias semiconductor device configured to set a potential of the floating buried doped region.

In another embodiment, a semiconductor device structure comprises a semiconductor substrate having first and second opposing major surfaces, wherein the semiconductor substrate comprises a floating buried doped region of a first conductivity type; a first doped region of a second conductivity type disposed between the floating buried doped region and the first major surface; and a semiconductor region of the second conductivity type disposed between the floating buried doped region and the second major surface. A pair of laterally separated trench isolation portions extends from the first major surface through the first doped region, extends through the floating buried doped region, and extends into the semiconductor region. An insulated trench structure is laterally disposed between the pair of laterally separated trench isolation portions and extends from the first major surface and terminates within the floating buried doped region, wherein the insulated trench structure defines a first portion and a second portion of an active region, and the first portion and the second portion are electrically coupled together through the floating buried doped region. A semiconductor device is disposed within the second portion of the active region and within the first doped region. A first conductive electrode is electrically coupled to the semiconductor device, and a second conductive electrode is electrically coupled to the first portion of the active region, wherein the second conductive electrode, the first portion of the active region, and the floating buried doped region form a bias semiconductor device. The bias semiconductor device is adapted to set a potential of the floating buried doped region and adapted to divert parasitic currents away from the semiconductor device.

In a further embodiment, a method of forming a semiconductor device comprises providing a semiconductor substrate having first and second opposing major surfaces, wherein the semiconductor substrate comprises a floating buried doped region of a first conductivity type; a first doped region of a second conductivity type disposed between the floating buried doped region and the first major surface; and a semiconductor region of the second conductivity type disposed between the floating buried doped region and the second major surface. The method includes forming a pair of laterally separated trench isolation portions extending from the first major surface through the first doped region, extending through the floating buried doped region, and extending into the semiconductor region. The method includes forming an insulated trench structure laterally disposed between the pair of laterally separated trench isolation portions and extending from the first major surface and terminating within the floating buried doped region, wherein the insulated trench structure defines a first portion and a second portion of an active region, and the first portion and the second portion are electrically coupled together through the floating buried doped region. The method includes providing a semiconductor device disposed within the second portion of the active region and within the first doped region. The method includes forming a first conductive electrode electrically coupled to the semiconductor device. The method includes forming a second conductive electrode electrically coupled to the first portion of the active region, wherein the second conductive electrode, the first portion of the active region, and the floating buried doped region form a bias semiconductor device, and the bias semiconductor device is adapted to set a potential of the floating buried doped region and adapted to divert parasitic currents away from the semiconductor device. In a still further embodiment, the pair of laterally separated trench isolation portions and the insulated trench structure are formed in a single formation step, such as a single etch step.

Turning now to the drawings, FIG. 1 illustrates an enlarged partial cross-sectional view of a device 10, an electronic device 10, a semiconductor device structure 10, or a semiconductor device 10 having a self-isolating bulk semiconductor substrate 11 or self-isolating bulk semiconductor region 11. In accordance with the present embodiment, device 10 includes one or more bias devices 300 (for example, bias devices 300A and 300B) or bias semiconductor devices 300, and one or more functional devices 23 formed as part of semiconductor substrate 11. In accordance with the present embodiment, bias devices 300A and 300B are configured to establish a potential on a buried floating region and to collect parasitic currents generated from various regions of device 10 as described in more detail later.

In one embodiment, semiconductor substrate 11 is configured to have improved thermal conductivity compared SOI substrates, and improved device density and performance compared to bulk substrates that use lateral junction isolation structures and/or doped sinker structures. In one embodiment, semiconductor device 10 is configured as a smart power semiconductor device including analog, digital, and power functionality integrated as functional devices 23 within (e.g., including on and in) semiconductor substrate 11. In the present embodiment, semiconductor substrate 11, which includes a major surface 18 and an opposing major surface 19, includes a p-type semiconductor region 12 or PSUB wafer 12. In one embodiment, semiconductor region 12 is a silicon region or wafer doped with boron, and has a dopant concentration in a range from about $4.0 \times 10^{18}$ atoms/cm$^3$ to about $1.0 \times 10^{19}$ atoms/cm$^3$ or more. It is understood that semiconductor region 12 can comprise a plurality of p-type layers of different dopant concentration. Additionally, it is understood that semiconductor region 12 can include other types of materials including, but not limited to, heterojunction semiconductor materials. In accordance with the present embodiment, semiconductor region 12 is configured to be connected to a potential (denoted generally by node 25) or configured to be a floating region (i.e., no ohmic or low-ohmic external voltage is imposed on semiconductor region 12 through node 25).

Semiconductor substrate 11 further includes a doped region 22, doped layer 22, or doped pockets 22 adjacent to major surface 18. In one embodiment, doped region 22 can be a p-type conductivity region or layer and can be formed using epitaxial growth techniques, ion implantation and diffusion techniques, or other methods as known to those skilled in the art. In some embodiments, doped region 22 has a dopant concentration in a range from about $1.0 \times 10^{15}$ atoms/cm$^3$ to about $1.0 \times 10^{16}$ atoms/cm$^3$. In one embodiment, doped region 22 has a dopant concentration of about $3.0 \times 10^{15}$ atoms/cm$^3$. It is understood that the dopant concentration of doped region 22 as well as its thickness is adjusted in accordance with the desired characteristics of the functional devices 23 formed within semiconductor substrate 11. In another embodiment, doped region 22 can have a graded dopant profile. In a further embodiment, doped region 22 comprises a plurality of p-type layers of different dopant concentration. In a still further embodiment, doped region 22 has a substantially uniform dopant concentration in a direction substantially perpendicular to major surface 18.

In accordance with the present embodiment, semiconductor substrate 11 further includes a floating buried or subsurface doped region 13, floating buried doped layer 13, or separation layer 13 disposed between semiconductor region 12 and doped region 22. In one embodiment, floating buried doped region 13 is configured to include an n-type layer 14 or buried doped region 14 and an n-type buried layer 16 or buried region 16. In another embodiment, floating buried doped layer 13 includes only buried region 16. Another embodiment of floating buried doped region 13 is described later in conjunction with FIG. 2.

In the present embodiment, floating buried doped region 13 is an electrically floating region, which means that no ohmic or low-ohmic external voltage is imposed on floating buried doped region 13. More particularly, semiconductor substrate 11 and device 10 are configured without any conductive or doped semiconductor structures providing an ohmic or highly doped contact or direct electrical pathway to buried layer 13. Stated another way, doped region 22 and semiconductor region 12 are formed or provided absent any diffused contact structures or conductive contact structures making direct or low-ohmic contact to floating buried doped region 13. Stated a different way, doped region 22 and semiconductor region 12 are configured so that no low-ohmic external voltage is imposed on floating buried doped region 13. In a preferred embodiment, floating buried doped region 13 extends laterally all the way or entirely across semiconductor region 12 between adjacent trench isolation regions 20A and 20B as illustrated in FIG. 1. More particularly, floating buried doped region 13 abuts or adjoins a pair of spaced apart trench isolation regions 20A and 20B in cross-sectional view. Stated another way, floating buried doped region 13 completely vertically separates doped region 22 from semiconductor region 12 with no portion of doped region 22 directly contacting semiconductor region 12 between trench isolation regions 20A and 20B. In one preferred embodiment, floating buried doped region 13 functions together with trench isolation regions 20A and 20B to provide one or more electrically isolated doped regions 22 for device 10. Specifically, the present embodiment uses a back-to-back (i.e., anti-series) diode configuration 130 (comprising diodes 420 and 432) between p-type doped region 22, n-type floating buried doped region 13, and p-type semiconductor region 12 as part of a preferred isolation scheme, structure, or configuration.

In the present embodiment, semiconductor substrate 11 and device 10 are configured without doped sinker regions extending from major surface 18 to n-type floating buried doped region 13 where the doped sinker regions and n-type floating buried doped region 13 have the same conductivity type and directly contact each other. Further, semiconductor substrate 11 and device 10 are provided absent or without any laterally extending buried oxides or SOI structures that partially or completely vertically separate doped regions 22 from semiconductor region 12. Previously, it was believed that in order to have p-type doped regions 22 on top of a p-type semiconductor region 12 it was required to either provide n-type sinkers extending from major surface 18 to the buried layer to provide necessary isolation for the functional devices within doped region 22 and/or to define the potential of the buried layer; or to use a buried oxide isolation or SOI isolation scheme between doped regions 22 and semiconductor region 12. However, it was found in practice that this is not the case and that the potential of n-type floating buried doped region 13 can electrically configure itself in accordance with the present embodiments so as to form an electrical barrier between doped region 22 and semiconductor region 12.

In accordance with the present embodiment, self-isolating bulk semiconductor substrate 11 advantageously provides a bulk substrate configuration that has the compactness or circuit density of SOI substrates compared to substrates using diffused sinker structures, has improved thermal performance compared to SOI substrates, enables reduced coupling between device pockets 21 and semiconductor region 12, and has a significantly lower substrate cost compared to SOI substrates—at least 30% lower in comparative base substrate cost. Also, functional devices 23 disposed within doped regions 22 can freely float positive and negative versus the potential of semiconductor region 12. Additionally, the self-biasing aspect of floating buried doped region 13 enables the PNP vertical transistor (or back-to-back diode 130) to function as if semiconductor substrate 11 was an SOI-like substrate without the associated disadvantages of SOI. In addition, because semiconductor substrate 11 and semiconductor device 10 are provided without diffused sinker regions or other direct contact structures, the lateral distance between isolation structures 20A and 20B can be reduced to provide active area gains (similar to SOI substrates), which reduces costs significantly. Further, semiconductor substrate 11 comprises a semiconductor material and therefore does not have the thermal disadvantages associated with SOI substrates (i.e., thermal resistances reduced or substantially eliminated). Moreover, semiconductor substrate 11 is manufactured using available epitaxial growth, ion implantation, and/or diffusion techniques, which provides for cost effective manufacturing.

As set forth previously, device 10 further includes isolation structures 20A and 20B, dielectric isolation structures 20A and 20B, trench isolation structures 20A and 20B, first insulated trench structures 20A and 20B, or trench isolation regions 20A and 20B extending from major surface 18 downward or substantially vertically into region 12 of semiconductor substrate 11. In accordance with the present embodiment, trench isolation structures 20A and 20B are configured to laterally isolate, both physically and electrically, adjacent device active regions or pockets 21 (further designated as 21A, 21B, and 21N) within semiconductor substrate 11 where functional devices 23 and bias devices 300A and 300B are provided. Stated another way, trench isolation structures 20A and 20B are configured to laterally isolate, both physically and electrically, layer 22 of a given pocket (e.g., 21B) from any adjacent layers 22 belonging to one or more adjacent pockets (e.g., 21A, 21N), and to isolate floating buried doped region 13 of a given pocket from any adjacent floating buried doped regions 13 belonging to adjacent pockets. In one embodiment, trench isolation structures 20A and 20B are part of an interconnected and continuous trench isolation structure 20 illustrated, for example, in FIGS. 14-17. In another embodiment, trench isolation structures 20A and 20B can be individual isolation structures.

Functional devices 23 can include, for example, power metal-oxide semiconductor ("MOS") devices, such as LDMOS devices, diode devices, complementary MOS ("CMOS") and/or bipolar logic devices, CMOS and/or bipolar analog devices, sensor devices, bipolar power transistor devices, insulated gate bipolar transistor ("IGBT") power devices, thyristors power devices, other power devices, and other similar semiconductor devices as known to those skilled in the art. It is understood that multiple functional devices 23, may be instantiated inside doped region 22 within the confines of a given pocket 21A-21N delineated by trench isolation structures 20A and 20B and insulated trench structures 24A and 24B described later. Stated another way, a given pocket 21 may include multiple functional devices 23, as is common practice in smart power technologies. Also, it is understood that functional devices 23 have been illustrated in simplified form so as to not distract from the present disclosure. Those skilled in the art understand that functional device 23 can include additional doped regions, isolation regions, and contact regions or structures.

In accordance with the present embodiment, device 10 further includes insulated trench structures 24A and 24B, trench structures 24A and 24B, or trench regions 24A and 24B extending from major surface 18 downward or substantially vertically into semiconductor substrate 11. However, insulated trench structures 24A and 24B are different from trench isolation structures 20A and 20B in that insulated trench structures 24A and 24B terminate within n-type floating buried doped region 13 without extending all the way through n-type floating buried doped region 13. Stated another way, insulated trench structures 24A and 24B electrically and physically isolate adjoining portions of layer 22 within a given pocket 21, however, indirect electrical communication between the adjoining portions of layer 22 within a given pocket 21 can be facilitated through a common n-type floating buried doped region 13. More particularly, at least a portion 135 of n-type floating buried doped region 13 extends uninterrupted between a pair of spaced apart trench isolation structures 20A and 20B as generally illustrated in FIG. 1.

In one embodiment, one or more of insulated trench structures 24A and 24B terminate within n-type buried layer 16. In another embodiment, one or more of insulated trench structures 24A and 24B terminate within n-type buried layer 14. In a further embodiment, one of insulated trench structures 24A and 24B can terminate within n-type buried layer 16, and the other of insulated trench structures 24A and 24B can terminate within n-type buried layer 14. In one embodiment, insulated trench structures 24A and 24B are disposed inside a perimeter 206 defined by trench isolation structure 20, which includes trench isolation structures 20A and 20B. In one embodiment, insulated trench structure 24A defines a first portion 210A of active region 21B or active pocket 21B where bias device 300A is disposed, and a second portion 211A where at least one functional device 23 is disposed. In one embodiment, insulated trench structure 20B defines another portion 211B of active pocket 21B where bias device 300B can be disposed in some embodiments.

In accordance with the present embodiment, the trenches for trench isolation structures 20A and 20B and for insulated trench structures 24A and 24B can be formed or etched at the same time. Further, the depth of the trenches for insulated trench structures 24A and 24B can be controlled by the width 241 of the corresponding trench opening proximate to major surface 18 compared to the width 242 of the corresponding trench opening proximate to major surface 18 for the trenches for trench isolation structures 20A and 20B. In one embodiment, width 242 is in a range from about 1.5 microns to about 2.0 microns when the thickness of doped region 22 is about 8 microns to about 12 microns thick. In one embodiment, width 241 is in a range from about 0.5 microns to about 1.0 micron when the thickness of doped region 22 is about 8 microns to about 12 microns thick. In one preferred embodiment, width 241 is between about 0.5 microns and about 0.8 microns. It was found in practice that a width 241 of about 0.6 microns can be resolved effectively using I-Line photoresists and deep ultraviolet photolithography. It is understood that widths 241 and 242 are adjusted in accordance with design parameters, such as the thickness of doped region 22 and the thickness of floating buried layer 13 to place trench isolation structures 20A and 20B within semiconductor region 12 and insulated trench structures 24A and 24B in desired locations within common floating buried doped region 13. In one embodiment, trench isolation structures 20A and 20B and insulated trench structures 24A and 24B can be deep trench structures formed using deep reactive ion etching (DRIE) techniques. In most embodiments, the deep trench structures can be filled or at least lined using one or more dielectric materials 42. In another embodiment, the trenches are filled or lined with a combination of a dielectric liner 42 and polycrystalline semiconductor material 43. In some embodiments, trench isolation structures 20A and 20B include both dielectric material 42 and polycrystalline semiconductor material and insulated trench structures 24A and 24B only include dielectric material 42.

In one embodiment, device 10 further includes an insulating layer or layers 36 on, atop, or overlying major surface 18, which is subsequently provided with openings for providing conductive contacts 46 to functional devices 23 and bias devices 300A and 300B described later. In one embodiment, insulating layer 36 can be an oxide material formed using thermal oxidation processes, low-temperature deposition processes, or other techniques as known to those skilled in the art. In one embodiment, conductive contacts 46 comprise a conductive material, such as one or more metals including for example, aluminum, aluminum alloys, titanium, titanium nitride, tungsten, copper, combinations thereof, or other conductive materials as known to those skilled in the art. Insulating layer 36 can be other dielectric materials as known to those skilled in the art.

Device 10 further includes conductive electrodes 47, 48, and 49 disposed electrically connected to bias device 300A, function device 23, and bias device 300B respectively. Conductive electrodes 47, 48, and 49 can be materials similar to those described for conductive contacts 46. Additionally conductive interconnect structures and one or more interlayer dielectric ("ILD") structures can be incorporated (not shown) to provide input/output signals to device 10 and to interconnect the various functional devices 23 and bias devices 300A and 300B.

As set forth previously and in accordance with the present embodiment, device 10 further includes one or more bias devices 300A and 300B, biasing devices 300A and 300B, semiconductor device structures 300A and 300B, or bias semiconductor devices 300A and 300B. In one embodiment, bias device 300A is disposed in portion 210A of active region 21B and bias device 300B is disposed in a portion 210B of active region 21B such that functional device(s) 23 disposed in portion 211A of active region 21B is interposed between bias device 300A and bias device 300B. It is understood that in some embodiments, device 10 may include either bias device 300A or 300B, or device 10 may include both. Both are included in the present embodiment to illustrate two different kinds of bias device types. Other types of bias device embodiments are described later. In one embodiment, bias device 300A is a diode device and comprises a p-type doped region 323A disposed within p-type doped region 22 and spaced apart from floating buried doped region 13. In one embodiment, p-type doped region 323A is configured as a contact region and has a higher dopant concentration than p-typed doped region 22. In other embodiments, p-type doped region 323A is not used if the dopant concentration of p-type doped region 22 is sufficient for a desired contact resistance (e.g., an ohmic contact) with conductive contact 46.

In one embodiment, bias device 300B is configured as an NPN bipolar transistor device 433A and comprises an n-type doped region 423A disposed within p-type doped region 22 and spaced apart from floating buried doped region 13. In the present embodiment, n-type doped region 423A is configured as a collector region and is electrically shorted to p-type doped region 22, which is configured as the base region of device 433A. N-type floating buried doped region 13 is configured as the emitter region of device 433A. In the present embodiment, n-type region 423A is electrically shorted to p-type doped region 22 by conductive contact 46 and shares a common node 427A. Stated another way, bias device 300B is configured in a diode mode (i.e., collector-base shorted), and thereby forms a bypass diode for the base of the lateral PNP bipolar device formed by, for example, p-type bias pocket 210B configured as an emitter, n-type common floating buried doped region 13 configured as a base, and p-type functional device pocket 211A configured as a collector. The bypass diode advantageously dissipates the base current in the lateral PNP bipolar device, and also reduces the effective (perceived) beta of the device.

In accordance with the present embodiment, common n-type floating n-type doped region 13 is configured as a self-biased region because there is no direct external electrical potential applied to it. It was found in practice that any potential received by common n-type floating buried doped region 13 results from adjoining junctions within p-type regions 22 and p-type semiconductor region 12. In accordance with the present embodiment, it was also found in practice that potential of common n-type buried doped region 13 substantially equals the maximum potential placed on nodes 326A, 427A, 236, and 25 for a given pocket (for example, pocket 21B). By using bias devices, such as bias devices 300A and/or 300B, the potential of common n-type buried region 13 can be controlled independently from the potentials of functional devices 23 within a given pocket 21. Among other things, this provides increased design flexibility.

In accordance with the present embodiment, when the potential on node 326A of bias device 300A is higher than nodes 236, 427A, and 25, bias device 300A biases and pulls up the potential on common n-type floating buried doped 13 towards the potential on node 326A minus the forward voltage drop of diode 410A. In addition, when node 326A is biased to a potential that is larger or equal to the potential on node 236 and on node 427A, the diode 420 formed by p-type region 22 and n-type floating buried doped region 13 in active region 211A cannot function as a base/emitter junction of a parasitic NPN transistor, and any electron currents injected from p-type semiconductor region 12 is redirected to bias device 300A. This advantageously minimizes the impact of such parasitic currents on functional devices 23.

In the alternative, when the potential on node 427A of bias device 300B is higher than nodes 236, 326A, and 25, bias device 300B biases and pulls up the potential on common n-type floating buried doped region 13 to the potential on node 427A minus the forward voltage drop of base/emitter diode of the NPN transistor device. In accordance with the present embodiment, bias devices 300A and 300B are configured, in general, as virtual sinker-like regions to control the potential on common n-type floating buried doped region 13 without having to use actual sinker regions to provide ohmic contact or direct bias to region 13. This improves the performance and stability of device 10 and also avoids the disadvantages of sinker regions as described previously.

Figure 2:
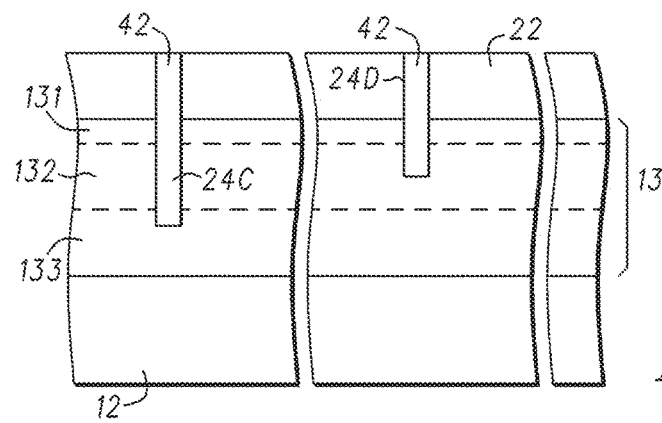
FIG. 2 illustrates an enlarged partial cross-sectional view of alternative embodiments of a floating buried doped region and insulated trench structures in accordance with the present invention.

FIG. 2 illustrates a partial cross-sectional view of a portion of semiconductor substrate 11 in accordance with one preferred embodiment. In this embodiment, n-type floating buried doped region 13 has a varying dopant profile or varying dopant concentration designated for example, as regions or portions 131, 132, and 133. Since floating buried doped region 13 does not have to make a low-ohmic contact to a contact structure (e.g., a diffused contact or trench contact), it is not important for region 131 (i.e., the region that adjoins doped region 22) of floating buried doped region 13 to be of a high dopant concentration (e.g., does not have to doped greater than $1.0 \times 10^{19}$ atoms/cm$^3$). This allows for region 131 of floating buried doped region 13 to have a lower dopant concentration, which beneficially facilitates the optimization of junction breakdown (e.g., provides lower electric field in region 131 of floating buried doped region 13) or depletion region reach-through (e.g., provides lower penetration of space charge regions within doped region 22) characteristics of the functional devices and bias devices integrated within doped region 22. In a further preferred embodiment, region 132 of floating buried doped region 13 has a higher dopant concentration than region 131, which beneficially facilitates the control of parasitics within device 10. For example region 132 facilitates the elimination of or reduces the effects of the base region of a parasitic vertical PNP transistor formed by p-type doped region 22, n-type floating buried doped region 13, and p-type semiconductor region 12. In one embodiment, region 133 of floating buried doped region 13 has a lower dopant concentration than region 132 and a lower dopant concentration than region 131. It is understood that the thicknesses of each of the regions 131-133 can be different or the same depending on the performance requirements of device 10.

By way of example, region 131 has a dopant concentration in a range from about $1.0 \times 10^{15}$ atoms/cm$^3$ to about $1.0 \times 10^{17}$ atoms/cm$^3$ and a thickness in a range from 3 microns through about 5 microns; region 132 has a dopant concentration in a range from about $1.0 \times 10^{17}$ atoms/cm$^3$ to about $1.0 \times 10^{19}$ atoms/cm$^3$ and a thickness in a range from about 1 micron through about 3 microns; and region 133 has a dopant concentration in a range from about $1.0 \times 10^{15}$ atoms/cm$^3$ to about $1.0 \times 10^{17}$ atoms/cm$^3$ and thickness in a range from about 3 microns through about 5 microns. In another embodiment, floating buried doped region 13 has graded dopant profile. In a further embodiment, floating buried doped region 13 has a substantially constant dopant concentration. Floating buried doped region 13 can be doped with one or more of phosphorous, arsenic, or antimony. In one embodiment of floating buried doped region 13 using doped region 14 and buried layer 16, doped region 14 has a thickness/depth in a range from about 12 microns to about 18 microns, and buried layer 16 has a thickness/depth in a range from about 3 microns to about 5 microns.

In some embodiments, floating buried doped region 13 has an as-formed dopant profile formed using epitaxial growth techniques. In other embodiments, floating buried doped region 13 and doped region 22 can be formed together using epitaxial growth techniques. In some embodiments, floating buried doped region 13 can be formed using ion implantation and diffusion techniques or other techniques as known to those skilled in the art. In one embodiment, a portion of floating buried doped region 13 is formed using epitaxial growth techniques and another portion of floating buried doped region 13 can be formed using ion implantation techniques. The implanted dopant can be diffused separately or during the epitaxial growth process for forming doped region 22.

In accordance with the present embodiment, FIG. 2 further illustrates insulated trench structures 24C and 24D in accordance with alternative embodiments. In the present embodiments, insulated trench structures 24C and 24D are illustrated with dielectric material 42 in contrast the insulated trench structures 24A and 24B illustrated in FIG. 1. In accordance with one embodiment, one or more of the insulated trench structures can terminate within region 133 of floating buried doped region 13 (illustrated by insulated trench structure 24C). In another embodiment, one or more of the insulated trench structures terminate within region 132 of floating buried doped region 13 (illustrated by insulated trench structure 24D). An embodiment using insulated trench structure 24C facilitates a structure adapted to reduce the gain of parasitic devices present in semiconductor device 10. Also, an embodiment using insulated trench structure 24D facilitates a structure adapted both to reduce parasitic gain and to reduce lateral resistance.

Figure 3:
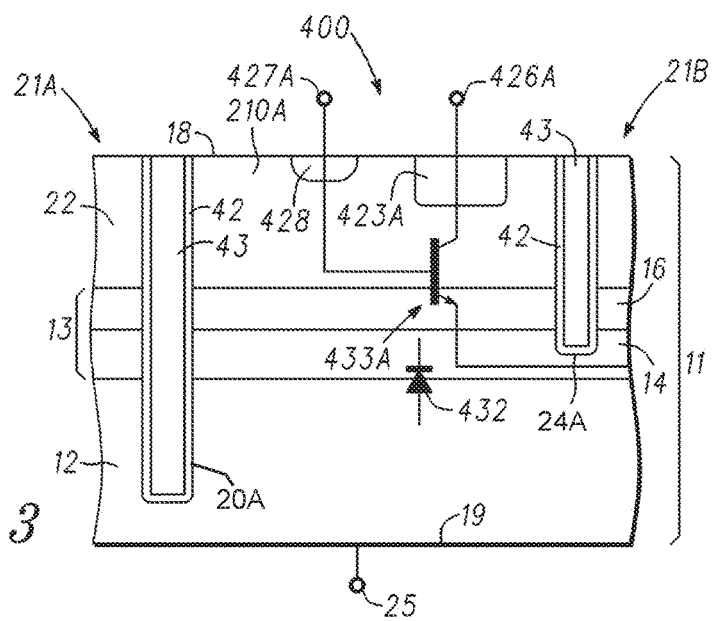
FIG. 3 illustrates an enlarged partial cross-sectional view of a further embodiment of a biasing device in accordance with the present invention.

FIG. 3 illustrates an enlarged partial cross-sectional view of a bias device 400 or biasing device 400, in accordance with another embodiment of a bias device. Bias device 400 can be used in addition to bias device 300A and 300B in semiconductor device 10, or bias device 400 can be used in place of one or more of bias devices 300A and 300B in semiconductor device 10. In this alternative embodiment of device 10, bias device 400 is illustrated within portion 210A of active region 21B. In one embodiment, bias device 400 includes an n-type doped region 423A disposed within p-type doped region 22. Bias device 400 further includes a p-type doped region 428 laterally spaced apart from n-type doped region 423A. In accordance with the present embodiment, bias device 400 is configured as an NPN bipolar transistor 433A similar to bias device 300B, except n-type doped region 423A is connected to a separate node 426A and p-type doped region 22 is connected to a separate node 427A.

In accordance with the present embodiment, with a positive bias on node 427A and the potential on node 426A above the potential of common n-type floating buried doped region 13, NPN bipolar transistor 433A operates in an emitter follower mode to bias and pull up common n-type floating buried doped region 13 towards the potential on node 427A minus a forward voltage drop of the diode. In accordance with the present embodiment, bias device 400 is an example of a bipolar transistor device configured to independently control the potential of n-type floating buried doped region 13, and to reduce the impact of parasitic currents on adjacent functional devices 23 sharing common n-type floating buried doped region 13 with bias device 400. In accordance with the present embodiment node or electrode 427A is an example of a separate or third conductive electrode electrically connected to doped region 22 within a respective bias device. In accordance with the present embodiment, bias device 400 is configured in general as a virtual sinker region to control the potential on common n-type floating buried doped region 13 without having to use actual sinker regions to provide ohmic contact or direct bias to region 13. This improves the performance and stability of device 10 and also avoids the disadvantages of sinker regions as described previously.

Figure 4:
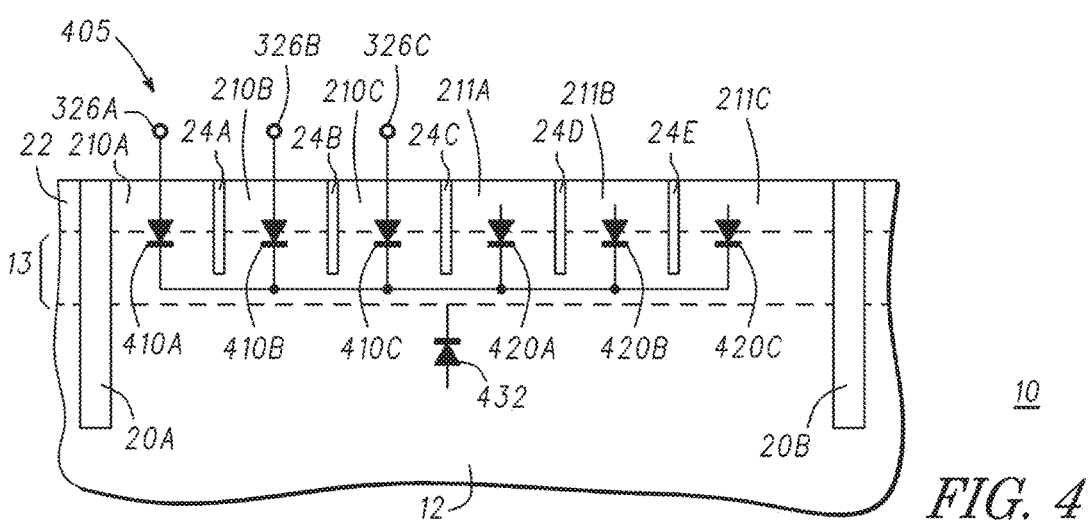
FIG. 4 is a circuit schematic representation superimposed on a partial cross-sectional view of a semiconductor device having a floating buried doped region, one or more biasing devices, and one or more functional devices in accordance with an embodiment of the present invention.

FIG. 4 is a circuit schematic 405 superimposed on a cross-sectional view of another embodiment of semiconductor device 10 to illustrate a circuit representation of p-type bias device pockets 210A, 210B, and 210C (PEPI_bias_A-C), p-type functional device pockets 211A, 211B, and 211C (PEPI_ckt_A-C), common n-type floating buried doped region 13 (NBL), and p-type semiconductor region 12 (PSUB). It is understood that semiconductor device 10 can include additional (or fewer) p-type bias device pockets and additional (or fewer) p-type functional pockets sharing a common n-type floating buried doped region 13, and the number selected for each in the present embodiment is for illustration purposes only.

In the present illustration, diodes 410A-410C are formed between the respective p-type bias device pockets 210A-210C and common n-type floating buried doped region 13, and diodes 420A-420C are formed between the respective p-type functional device pockets 211A-211C and common n-type floating buried doped region 13. Diodes 410A-C can be similar to bias device 300A as described previously with FIG. 1. As illustrated previously in FIG. 1, diode 432 is formed between common n-type floating buried doped region 13 and semiconductor region 12. In accordance with the present embodiment, it was found in practice that the potential of the common n-type floating buried doped region 13 can be substantially defined as V(NBL)=maximum (PSUB, PEPI_ckt_A-C, PEPI_bias_A-C). Stated another way, the potential on the NBL is set by the highest potential among PSUB (e.g., semiconductor region 12), any of the PEPI_ckt_A-C (e.g., functional device pockets 211A-211C), and any of the PEPI_bias_A-C (e.g., bias device pockets 210A-210C). In accordance with the present embodiment, the PEPI_ckt_A-C regions (e.g., functional device pockets 211A-211C), the PSUB region (e.g., semiconductor region 12), and the PEPI_bias_A-C regions (e.g., bias device pockets 210A-210C) are adapted to have an equal opportunity to influence the potential on common n-type floating buried doped region 13 or the NBL.

Figure 5:
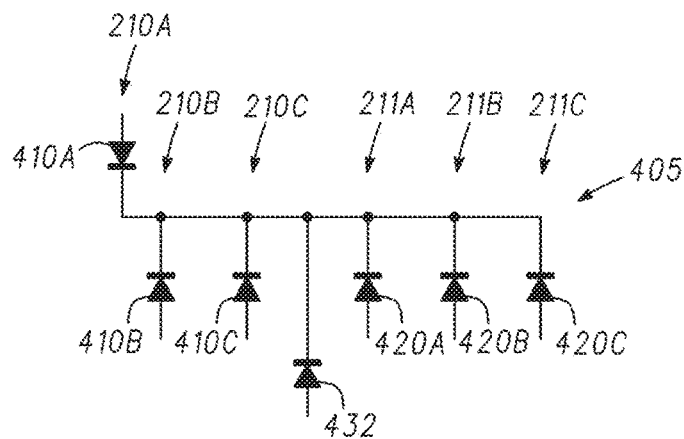
FIGS. 5-8 are circuit schematics based on FIG. 4 illustrating various operational aspects of an embodiment of the present invention.

FIG. 5 illustrates the circuit schematic 405 where diode 410A formed by p-type bias pocket 210A and common n-type floating buried doped region 13 is electrically connected to a potential that is larger than or equal to all of the potentials of p-type functional device pockets 211A-211C. In one embodiment, diode 410A is electrically connected to a supply. In another embodiment, diode 410A is electrically connected to a lowest resistance node in the applicable system within semiconductor device 10. In a further embodiment, diode 410A is electrically connected to ground. In a still further embodiment, diode 410A is electrically connected to any reference potential within the breakdown or $BV_{CEO}$ limits of the parasitic devices existing as part of semiconductor device 10.

Figure 6:
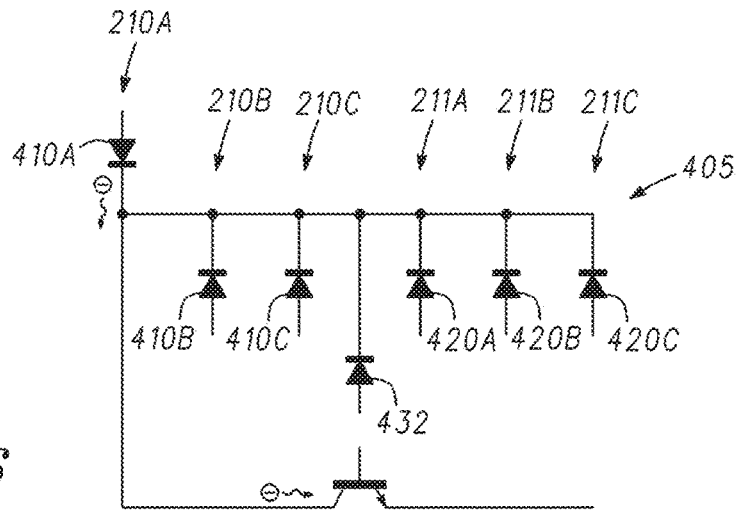
Figure 7:
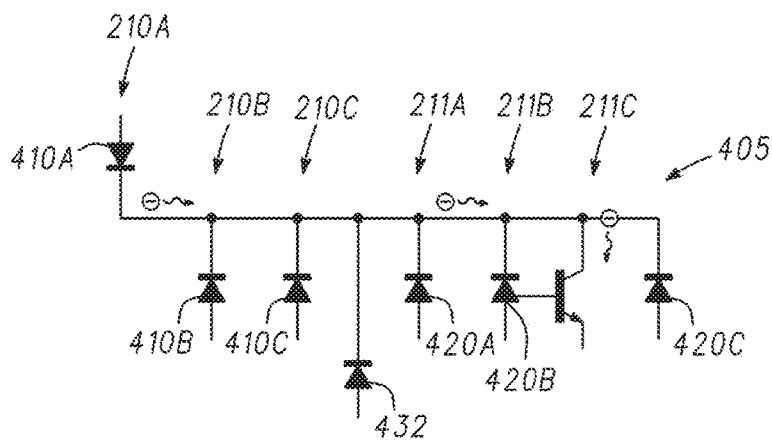

In accordance with the present embodiment, with diode 410A adapted to set the potential on common n-type floating buried doped region 13, diodes 420A, 420B, and 420C can no longer function as base/emitter junctions of the parasitic NPN transistors formed between common n-type floating buried doped region 13, p-type functional device pockets 211A, 211B, and 211C, and n-type doped regions (not shown) that may be disposed within p-type functional device pockets 211A, 211B, and 211C respectively. In this case, and as illustrated in FIG. 6, any electron currents injected from p-type semiconductor region 12 into the common n-type floating buried doped region 13 are redirected to diode 410A (illustrated in FIG. 6) thereby reducing the effects of such parasitic currents on p-type functional device pockets 211A, 211B, and 211C. Additionally, and as illustrated in FIG. 7, diode 410A is adapted to collect electron currents generated within any of the p-type functional device pockets 211A-211C residing above common n-type floating buried doped region 13.

Figure 8:
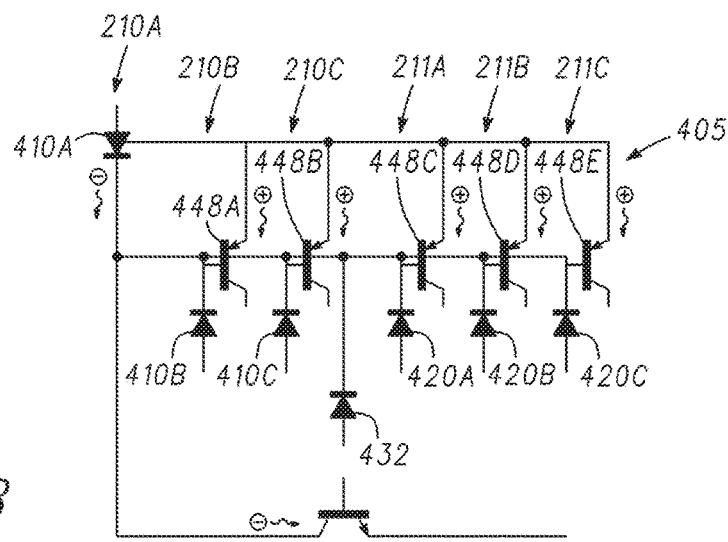

FIG. 8 is a circuit representation of parasitic lateral PNP transistors 448A-E formed by p-type bias device pockets 210B and 210C and p-type functional device pockets 211A-211C acting as emitters with the common n-type floating buried doped region 13 acting as the base, and any of the p-type pockets (210B, 210C, 211A, 211B, 211C) that are below the potential of common n-type floating buried doped region 13 acting as potential collectors in accordance with the present embodiment.

Figure 9:
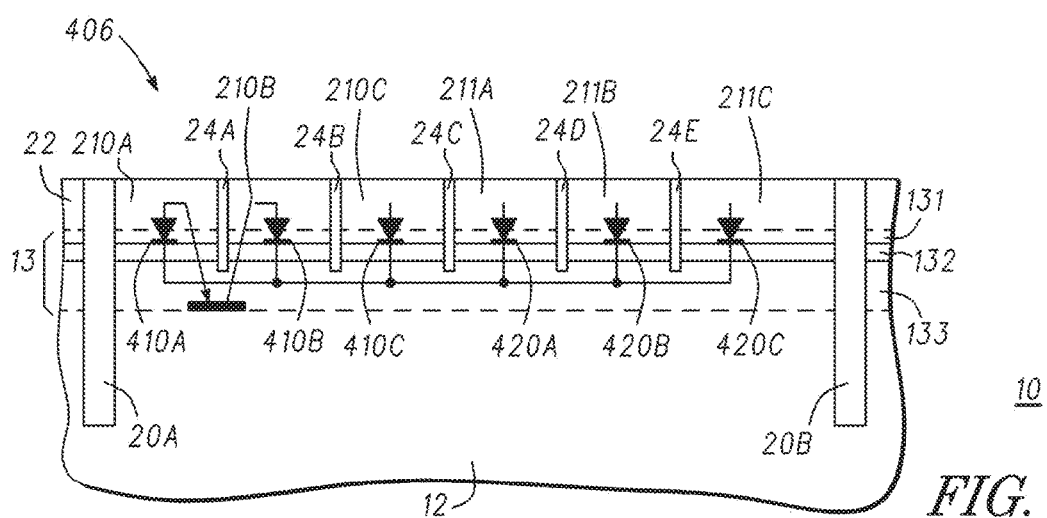
FIG. 9 is a circuit schematic representation superimposed on a partial cross-sectional view of a semiconductor device having a floating buried doped region, one or more biasing devices, and one or more functional devices in accordance with an embodiment of the present invention.

FIG. 9 is a circuit schematic 406 superimposed on a cross-sectional view of another embodiment of semiconductor device 10 as further circuit representation of p-type bias device pockets 210A, 210B, and 210C, p-type functional device pockets 211A, 211B, and 211C, common n-type floating buried doped region 13, and p-type semiconductor region 12. As was described previously in conjunction with FIG. 2, in the present embodiment one or more of insulated trench structures 24A-24E extend completely through regions 131 and 132 and of common n-type floating buried doped region 13, but terminate within region 133. By passing through the higher doped region 132, this configuration is adapted to reduce parasitic gain.

Figure 10:
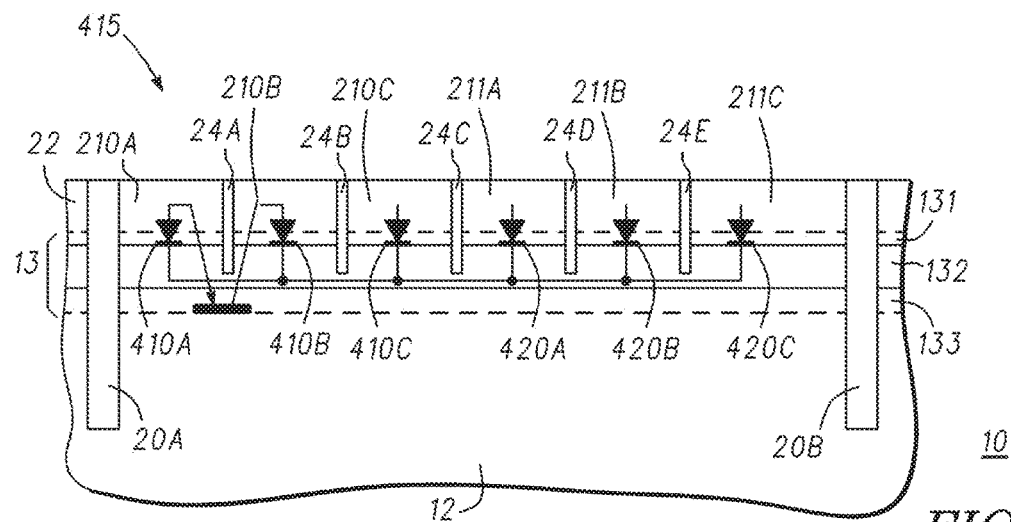
FIG. 10 is a circuit schematic representation superimposed on a partial cross-sectional view of a semiconductor device having a floating buried doped region, one or more biasing devices, and one or more functional devices in accordance with an embodiment of the present invention.

FIG. 10 is a circuit schematic 415 superimposed on a cross-sectional view of a further embodiment of semiconductor device 10 as a further circuit representation of type bias device pockets 210A, 210B, and 210C, p-type functional device pockets 211A, 211B, and 211C, common n-type floating buried doped region 13, and p-type semiconductor region 12. As was described previously in conjunction with FIG. 2, in the present embodiment one or more of insulated trench structures 24A-24E extend completely through region 131, but only extend partially into region 132 before terminating within region 132. By insulated trench structures 24A-24E passing only partially into high doped region 132, this configuration is adapted to both reduce parasitic gain and to reduce lateral resistance.

Figure 11:
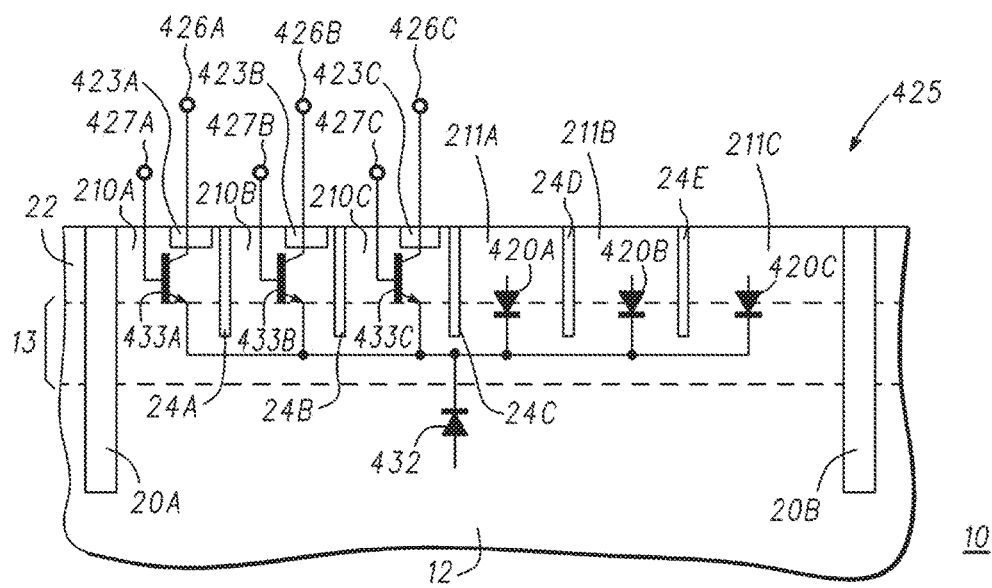
FIG. 11 is a circuit schematic representation superimposed on a partial cross-sectional view of a semiconductor device having a floating buried doped region, one or more biasing devices, and one or more functional devices in accordance with an embodiment of the present invention.

FIG. 11 is a circuit schematic 425 superimposed on a cross-sectional view of a still further embodiment of semiconductor device 10 as a further circuit representation of p-type bias device pockets 210A, 210B, and 210C, p-type functional device pockets 211A, 211B, and 211C, common n-type floating buried doped region 13, and p-type semiconductor region 12. In the present embodiment, p-type bias device pockets are further provided with n-type doped regions 423A, 423B, and 423C. In this configuration, n-type doped regions 423A-C, bias device pockets 210A-210C, and common n-type floating buried doped region 13 are configured as NPN bipolar devices 433A, 433B, and 433C similar to bias device 400 described previously. NPN bipolar devices 433A-B can be individually biased through nodes 426A-C and 427A-C, and with nodes 426A-C connected to, for example, a reference potential, n-type doped regions 423A-C function as collectors for parasitic currents within semiconductor device 10 thereby improving the performance of functional device pockets 211A-C. Also, this configuration helps to bypass the generally high ohmic p-type bias device pockets 210A-C to further improve performance.

Figure 12:
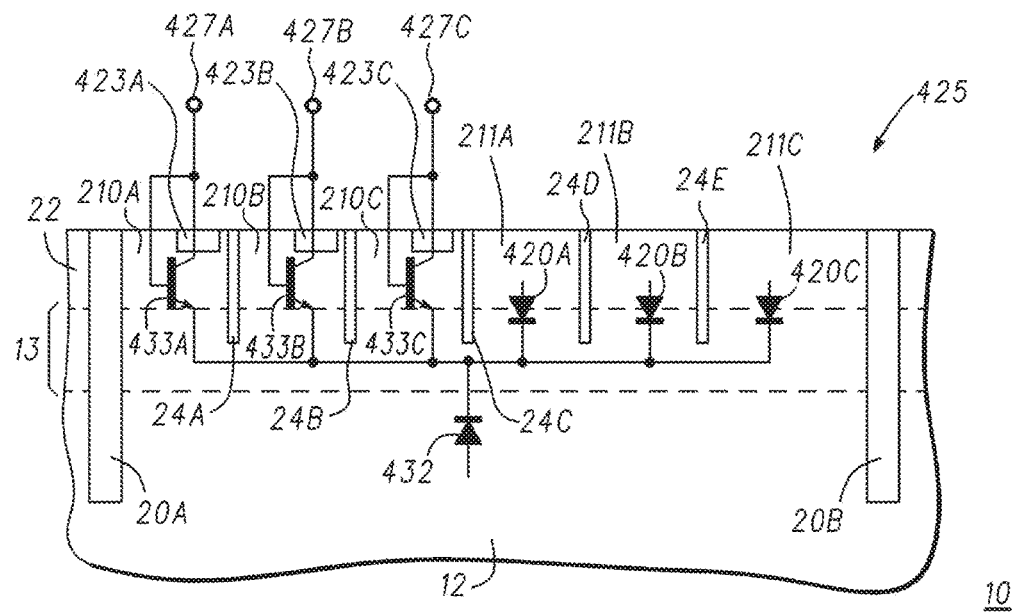
FIG. 12 is a circuit schematic representation superimposed on a partial cross-sectional view of a semiconductor device having a floating buried doped region, one or more biasing devices, and one or more functional devices in accordance with an embodiment of the present invention.

FIG. 12 illustrates an alternative embodiment of circuit schematic 425 where one or more of nodes 426A can be electrically connected to a respective node 427A-C similar to bias device 300B described previously. In this embodiment, one or more of NPN bipolar devices 433A-C are adapted to pick up electrons injected from semiconductor region 12 and then inject them into respective n-type regions 423A-C, which are acting as collectors. This configuration beneficially helps to bypass the generally higher ohmic p-type bias pockets 210A-C, and further provides for a better coupling of n-type common floating buried doped region 13 to the potential applied to n-type doped regions 423A-C. Additionally, NPN bipolar devices 433A-C are configured in a diode mode (i.e., collector-base shorted), and thereby form bypass diodes for the base of the lateral PNP bipolar devices formed by, one of p-type bias pockets 210A-C configured as an emitter, n-type common floating buried doped region 13 configured as a base, and one of the p-type functional device pockets 211A-C configured as a collector. The bypass diode advantageously dissipates the base current in the lateral PNP bipolar device, and also reduces the effective (perceived) beta of the device. In accordance with the present embodiment, n-type doped regions 423A-C can be n-type wells, n-type RESURF regions, n-type drift regions, and in some cases higher doped n-type regions since in this configuration n-type doped regions 423A-C are shorted to respective p-type bias pockets 210A-C.

Figure 13:
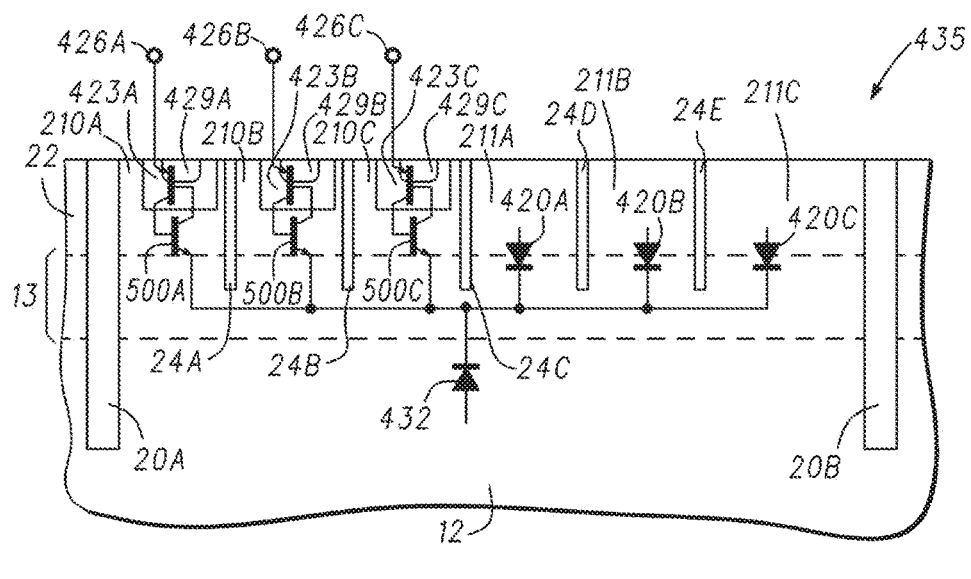
FIG. 13 is a circuit schematic representation superimposed on a partial cross-sectional view of a semiconductor device having a floating buried doped region, one or more biasing devices, and one or more functional devices in accordance with an embodiment of the present invention.

FIG. 13 is a circuit schematic 435 superimposed on a cross-sectional view of another embodiment of semiconductor device 10 as a further circuit representation of type bias device pockets 210A, 210B, and 210C, p-type functional device pockets 211A, 211B, and 211C, common n-type floating buried doped region 13, and p-type semiconductor region 12. In the present embodiment, an additional p-type doped region 429A, 429B, and 429C is disposed within n-type doped regions 423A, 423B, and 423C respectively to provide a four layer diode or an SCR configurations 500A, 500B, and 500C within bias device pockets 210A, 210B, and 210C. In one embodiment, nodes 426A-C are connected to p-type doped regions 429A-C with a biasing potential applied thereto. In accordance with the present embodiment, this configuration can pull-up or set the potential of n-type common floating buried doped region 13 using an SCR-like regenerative effect that can be initiated by electronic current injected from p-type semiconductor region 12.

It is understood that the different embodiments described herein can be used in combination with the other embodiments such that the bias devices in each of bias device pockets 210A-C can be the same or different within semiconductor device 10.

Figure 14:
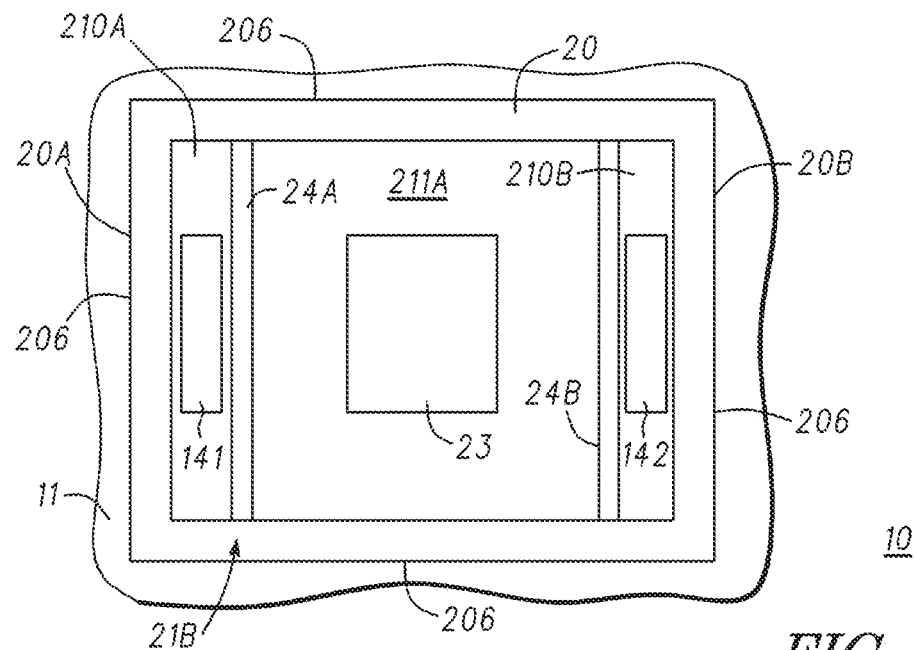
FIGS. 14-17 illustrate partial top plan views of layout configurations of semiconductor devices having a floating buried doped region, one or more biasing devices, and one or more functional devices in accordance with embodiments of the present invention.

FIG. 14 illustrates a top plan view of a portion of semiconductor device 10 in accordance with a first embodiment of a layout configuration. As illustrated, semiconductor device 10 includes trench isolation structure 20, which includes portions 20A and 20B as illustrated in FIG. 1. In accordance with the present embodiment, trench isolation structure 20 is disposed within semiconductor substrate 11 to provide perimeter 206, which encloses active region 21B as illustrated in FIGS. 1 and 14. In accordance with the present embodiment, insulated trench structure 24A is disposed within perimeter 206 and extends across two opposing sides of trench isolation structure 20 thereby defining portion 210A or first bias device pocket 210A of active region 21B where one or more bias devices 141 (which can be, for example, any one or more of bias devices 300A-B, 400, 433A-C, 500A-C) are disposed, and a second portion 211A or functional device pocket 211A where at least one functional device 23 is disposed.

In the present embodiment, insulated trench structure 24B is disposed within perimeter 206 and extends across two opposing sides of trench isolation structure 20 thereby defining portion 210B or second bias pocket 210B where one or more bias devices 142 are disposed (which can be, for example, any one or more of bias devices 300A-B, 400, 433A-C, 500A-C). In accordance with the present embodiment, bias device 141 is partially laterally isolated from functional device 23 by insulated trench structure 24A (which passes all the way through p-type doped region 22 as illustrated in FIG. 1), and bias device 142 is partially isolated from functional device 23 by insulated trench structure 24B (which passes all the way through p-type doped region 22 as illustrated in FIG. 1). In accordance with the present embodiment, bias devices 141 and 142 and functional device 23 share a common n-type floating buried doped region 13 as illustrated, for example, in FIG. 1. In accordance with the present embodiment, bias devices 141 and 142 are adapted to set, establish, or control the potential on common floating buried doped region 13 (illustrated, for example, in FIG. 1), and to divert parasitic currents away from functional device 23 thereby improving the performance of device 10. FIG. 14 illustrates an embodiment comprising of pair of bias device pockets 210A and 210B disposed at opposing sides or ends of active region 21B with a functional device pocket 211A interposed between the pair of bias device pockets 210A and 210B in the plan view.

Figure 15:
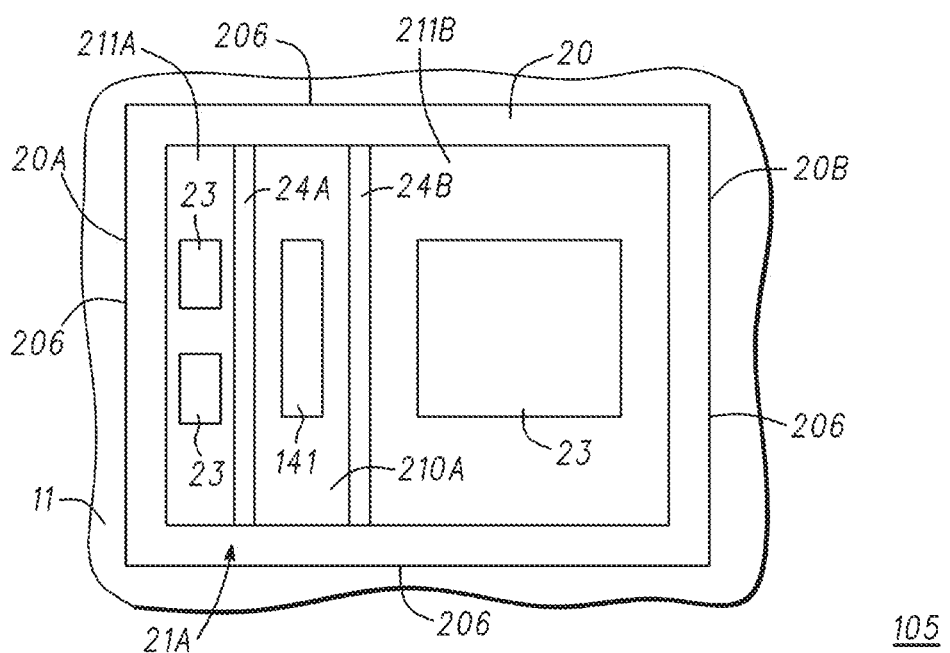

FIG. 15 illustrates a top plan view of a portion of a semiconductor device 105 in accordance with a second embodiment of a layout configuration. As illustrated, semiconductor device 105 also includes trench isolation structure 20, which includes portions 20A and 20B. In accordance with the present embodiment, trench isolation structure 20 is disposed within semiconductor substrate 11 to provide perimeter 206, which encloses an active region 21A. In the present embodiment, insulated trench structures 24A and 24B extend between a pair of sides of trench isolation structure 20 to define a functional device pocket 211A, a bias device pocket 210A, and a functional device pocket 211B. In accordance with the present embodiment, at least one bias device 141 (which can be, for example, any one of bias devices 300A-B, 400, 433A-C, 500A-C) is disposed within bias device pocket 210A, one or more functional devices are disposed within functional device pocket 211A, and one or more functional devices are disposed within functional device pocket 211B. FIG. 15 illustrates an embodiment where a bias device pocket (e.g., bias device pocket 210A) is interposed between a pair of functional device pockets (e.g., functional device pockets 211A and 211B) in the plan view. In accordance with the present embodiment, bias device 141 is adapted to set, establish, or control the potential on common floating buried doped region 13 (illustrated, for example, in FIG. 1), and to divert parasitic currents away from functional devices 23 thereby improving the performance of device 105.

Figure 16:
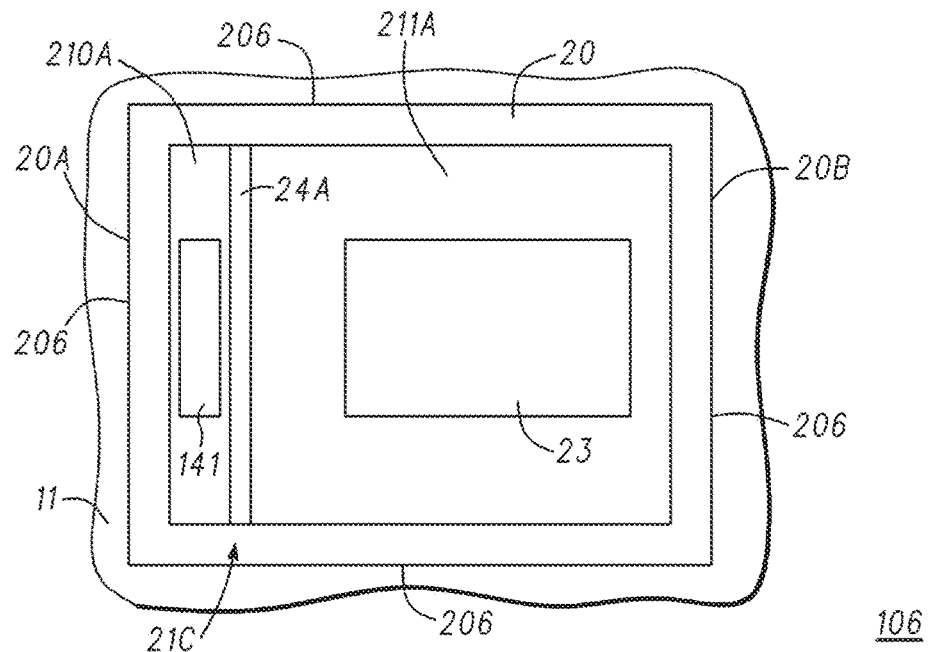

FIG. 16 illustrates a top plan view of a portion of a semiconductor device 106 in accordance with another embodiment of a layout configuration. The layout configuration of semiconductor device 106 is similar to the layout configuration of semiconductor device 10 of FIG. 14 except in the present embodiment, only one bias device pocket 210A with one or more bias device 141 (which can be, for example, any one of bias devices 300A-B, 400, 433A-C, 500A-C) is provided within an active region 21C. Active region 21C further includes functional device pocket 211A with one or more functional device 23. In accordance with the present embodiment, bias device 141 is adapted to set, establish, or control the potential on common floating buried doped region 13 (illustrated, for example, in FIG. 1) and to divert parasitic currents away from functional device 23 thereby improving the performance of device 106.

Figure 17:
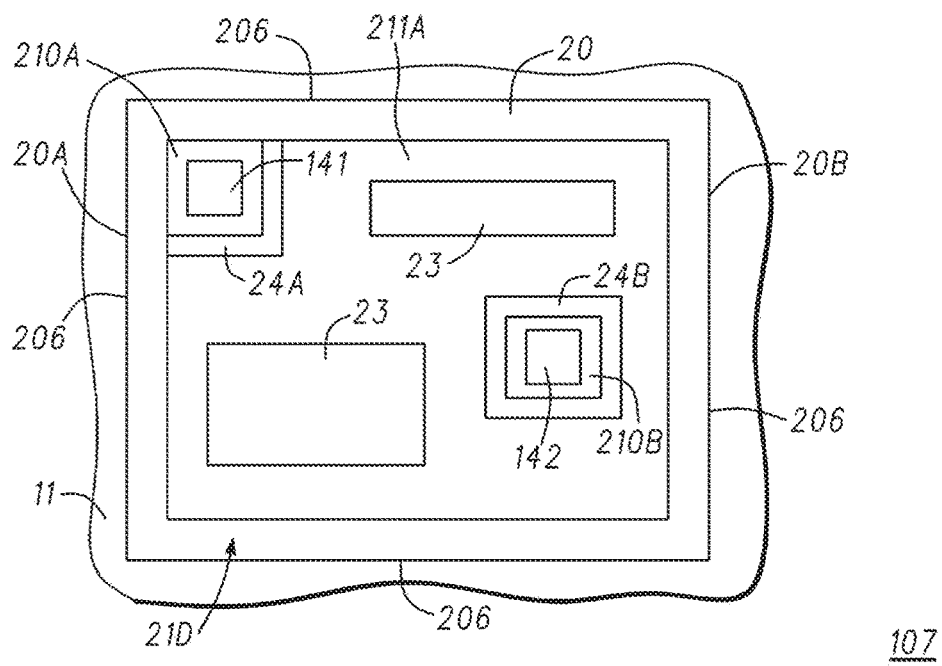

FIG. 17 illustrates a top plan view of a portion of a semiconductor device 107 in accordance with a further embodiment of a layout configuration. As illustrated, semiconductor device 107 includes trench isolation structure 20, which includes portions 20A and 20B. In accordance with the present embodiment, trench isolation structure 20 is disposed within semiconductor substrate 11 to provide perimeter 206, which encloses an active region 21D. In the present embodiment, insulated trench structure 24A is disposed in a corner of trench isolation structure 20 such that insulated trench structure 24 and the adjoining portion of trench isolation structure 20 to form a shape in the plan view. In one embodiment, the shape can be square as generally illustrated. In other embodiments the shape can be circular, rounded, or polygonal. Insulated trench structure 24A and a portion of trench isolation structure 20 define a bias device pocket 210A where at least one bias device 141 (which can be, for example, any one of bias devices 300A-B, 400, 433A-C, 500A-C) is disposed. In the present embodiment, this configuration places the bias device in a corner region of active region 21D to advantageously reduce the area occupied by bias device 141 to increase the area available for functional device 23.

In another embodiment, insulated trench structure 24B can be disposed within active region 21D (without or without insulated trench structure 24A and bias device 141) and can have a closed shape in the plan view to form bias pocket 211B where at least one bias device 142 (which can be, for example, any one of bias devices 300A-B, 400, 433A-C, 500A-C) is disposed. In one embodiment, the closed shape can be square as generally illustrated in FIG. 17. In other embodiments, the closed shape can be circular, rounded, or polygonal. In the present embodiment, functional device pocket 211A is disposed outside the perimeters defined by bias pockets 210A and 210B and within active region 21D, wherein one or more functional devices 23 are disposed. In some embodiments, bias device pocket 211B including insulated trench structure 24B and bias device 142 can be advantageously placed proximate to certain functional devices 23 that may be more sensitive to parasitic issues, which bias device 142 can be adapted to reduce. FIG. 17 illustrates an embodiment where a bias device pocket (e.g., bias device pocket 210B) is disposed within active region 21D and spaced apart from trench isolation structure 20 in the plan view. In accordance with the present embodiment, bias devices 141 and 142 are adapted to set, establish, or control the potential on common floating buried doped region 13 (illustrated, for example, in FIG. 1) and to divert parasitic currents away from functional devices 23 thereby improving the performance of device 107. It is understood that in the embodiments of FIG. 17, the corners of insulated trench structures 24A and 24B can be other than 90 degree corners including rounded corners.

In summary, the self-isolating bulk semiconductor substrate 11 has several advantages over prior substrates used in semiconductor technologies, such as smart power technologies. For example, semiconductor substrate 11 has more compact p-type doped regions 22 compared to previous bulk substrates using diffused sinker or other contact structure processes. This provides for advantageous device area gains. Also, the functional device 23 disposed within p-type doped regions 22 can freely float positive and negative versus semiconductor region 12. More particularly, the self-biasing characteristics of n-type floating buried doped region 13 functions so that the p-type doped region 22/n-type floating buried doped region 13/semiconductor region 12 vertical stack behaves similar to an SOI substrate within the constraints of the junction breakdown limits. Additionally, semiconductor substrate 11 has lower costs compared to previous bulk substrates by eliminating the sinker technology and SOI technology. In addition, semiconductor substrate 11 eliminates an inherent high gain lateral parasitic bipolar transistor present in bulk substrates using sinker technologies. Further, the junction between p-type doped region 22 and n-type floating buried layer region 13 behaves more like a one-dimensional junction, which increases breakdown performance. Moreover, semiconductor substrate 11 has higher thermal conductivity performance and less capacitive coupling compared to SOI substrates. Further, the separately provided biasing device adapted to set the potential of the floating buried doped region and to divert parasitic currents away from adjacent functional devices improves performance and stability, and further enhances design flexibility.

In a further embodiment, the self-isolating bulk semiconductor substrate consists essentially of a floating buried doped region of a first conductivity type, a doped region of a second conductivity type disposed between the floating buried doped region and the first major surface, and a semiconductor region of the second conductivity type disposed between the floating buried doped region and the second major surface.

In view of the above, it is evident that a novel device structure and method is disclosed. Included, among other features, is providing a self-isolating bulk semiconductor substrate that includes a floating buried doped region of a first conductivity type disposed between a doped region of a second conductivity type and a semiconductor region of the second conductivity type. In one embodiment, the first conductivity type is n-type and the second conductivity type is p-type. A trench isolation structure is provided that extends through the doped region and the floating buried doped region and extends into the semiconductor region to provide an active region. The floating buried doped region abuts or adjoins the trench isolation structure and is provided absent any structures that provide direct ohmic or direct low-ohmic electrical contact to it. An insulated trench structure is provided and extends through the doped region but terminates within the floating buried doped region to provide a first portion and a second portion of the active area. At least one biasing device is provided in the first portion of the active region and at least one functional device is provided within the second portion of the active region. The biasing device is configured to set or establish the potential of the floating buried doped region and to collect parasitic currents generated within the structure thereby improving the performance and stability of the one or more functional devices. The present method and structure further enhance design flexibility and are adapted to easily integrate into exiting process flows.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the embodiments disclosed herein can be used with an SOI bulk substrate structure.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A semiconductor device structure, comprising:
   a semiconductor substrate having a first major surface and an opposing second major surface, wherein the semiconductor substrate comprises:
      a floating buried doped region of a first conductivity type;
      a first doped region of a second conductivity type interposed between the floating buried doped region and the first major surface; and
      a semiconductor region of the second conductivity type disposed between the floating buried doped region and the second major surface;
   a trench isolation structure extending from the first major surface through the first doped region, extending through the floating buried doped region, and extending into the semiconductor region, wherein:
      the floating buried doped region adjoins the trench isolation structure; and
      the trench isolation structure defines a perimeter for an active region of the semiconductor device structure;
   an insulated trench structure extending from the first major surface through the first doped region and terminating within the floating buried doped region, wherein:
      the insulated trench structure is disposed within the perimeter of the trench isolation structure;
      the insulated trench structure defines a first portion and a second portion of the active region; and
      the floating buried doped region electrically couples the first portion and the second portion of the active region together;
   a first semiconductor device disposed within a first portion of the first doped region and within the first portion of the active region; and
   a second semiconductor device disposed in the second portion of the active region and comprising a second portion of the first doped region and the floating buried doped region, wherein the second semiconductor device is configured as a first bias semiconductor device adapted to set a potential of the floating buried doped region.

2. The structure of claim 1, wherein:
the second portion of the active region is laterally bounded in a plan view by the trench isolation structure and the insulated trench structure.

3. The structure of claim 1, wherein:
the trench isolation structure comprises a plurality of sides in a plan view;
the insulated trench structure is disposed to extend from a first side to an opposing second side of the trench isolation structure; and
the second portion of the active region is laterally bounded in the plan view by the insulated trench structure, the first side, the second side, and a third side extending between the first side and second side.

4. The structure of claim 1, wherein:
the insulated trench structure is configured so as to dispose the second portion of the active region in a corner portion of the trench isolation structure in a plan view.

5. The structure of claim 1, wherein:
the trench isolation structures defines a plurality of sides in a plan view;
the insulated trench structure comprises:
 a first part extending between a first side to an opposing second side of the trench isolation structure; and
 a second part extending between the first side to the opposing second side of the trench isolation structure;
the first part is laterally separated from the second part; and
the second portion of the active region is interposed between the first part and the second part.

6. The structure of claim 1, wherein:
the insulated trench structure comprises a closed shape in a plan view; and
the insulated trench structure is disposed such that no portion of the insulated trench structure physically contacts the trench isolation structure.

7. The structure of claim 1, wherein:
the insulating trench structure further defines a third portion of the active region;
the semiconductor device structure further comprises a third semiconductor device disposed in the third portion of active region;
the third semiconductor device comprising a third portion of the first doped region and the floating buried doped region;
the third semiconductor device is configured as a second bias semiconductor device adapted to set a potential of the floating buried doped region; and
the second semiconductor device and the third semiconductor device are in electrical communication through the floating buried doped region.

8. The structure of claim 7, wherein the floating buried doped region has a varying dopant concentration.

9. The structure of claim 7, wherein at least one of the second semiconductor device and the third semiconductor device comprises a bipolar transistor.

10. The structure of claim 1, wherein the second semiconductor device further comprises:
a second doped region of the first conductivity type disposed within the second portion of first doped region and separated from the floating buried doped region by the first doped region; and
a third doped region of the second conductivity type disposed within the second doped region.

11. The structure of claim 1, wherein:
the semiconductor device structure further comprises:
 a first conductive electrode electrically coupled to the first semiconductor device adjacent the first major surface of the semiconductor substrate; and
 a second conductive electrode electrically coupled to the second semiconductor device adjacent the first major surface of the semiconductor substrate;
the second semiconductor device further comprises a second doped region of the first conductivity type disposed within the second portion of the first doped region;
the second doped region is separated from the floating buried doped region by a portion of the first doped region; and
the second conductive electrode is adapted to electrically short the second doped region and the first portion of the first doped region together.

12. A semiconductor device structure, comprising:
a semiconductor substrate having a first major surface and an opposing second major surface, wherein the semiconductor substrate comprises:
 a floating buried doped region of a first conductivity type;
 a first doped region of a second conductivity type disposed between the floating buried doped region and the first major surface; and
 a semiconductor region of the second conductivity type disposed between the floating buried doped region and the second major surface;
a trench isolation structure extending from the first major surface through the first doped region, extending through the floating buried doped region, and extending into the semiconductor region, wherein:
 the floating buried doped region abuts the trench isolation structure; and
 the trench isolation structure defines a perimeter for an active region of the semiconductor device structure;
an insulated trench structure extending from the first major surface through the first doped region and terminating within the floating buried doped region, wherein:
 the insulated trench structure is disposed within the perimeter of the trench isolation structure;
 the insulated trench structure defines a first portion, a second portion, and a third portion of the active region; and
 the floating buried doped region electrically couples the first portion, the second portion, and the third portion of the active region together;
a first semiconductor device disposed within the first portion of the active region;
a first bias semiconductor device disposed within the second portion of the active region;
a second bias semiconductor device disposed within the third portion of the active region, wherein the first bias semiconductor device and the second bias semiconductor device are each adapted to set a potential of the floating buried doped region;
a first conductive electrode electrically coupled to the first semiconductor device;
a second conductive electrode electrically coupled to the first bias semiconductor device; and
a third conductive electrode electrically coupled to the second bias semiconductor device.

13. The structure of claim 12, wherein the first portion of the active region is interposed between the second portion and the third portion of the active region.

14. The structure of claim 12, wherein:
the insulated trench structure includes a portion that completely surrounds the second bias semiconductor device in a plan view; and
the portion that completely surrounds the second bias semiconductor device is laterally separated on all sides from the trench isolation structure in the plan view.

15. The structure of claim 12, wherein the second bias semiconductor device comprises:
a second doped region of the first conductivity type disposed within the first doped region;
the second doped region is separated from the floating buried doped region by a portion of the first doped region; and
the third conductive electrode is coupled so as to electrically short the second doped region and the first doped region together.

16. The structure of claim 12, wherein the floating buried doped region comprises:
a first region adjoining the first doped region;
a second region disposed between the first region and the semiconductor region, wherein the first region has a lower dopant concentration than the second region; and
a third region disposed between the second region and the semiconductor region, wherein the third region has a lower dopant concentration than the second region.

17. The structure of claim 16, wherein at least a portion of the insulated trench structure terminates within the third region of the floating buried doped region.

18. The structure of claim 16, wherein:
at least one of the first bias semiconductor device and the second bias semiconductor device comprises a diode; and
at least a portion of the insulated trench structure terminates within the second region of the floating buried doped region.

19. The structure of claim 12, wherein the first conductive electrode, the second conductive electrode, and the third conductive electrode are each adapted to be independently biased.

20. A method of forming a semiconductor device comprising:
providing a semiconductor substrate having a first major surface and an opposing second major surface, wherein the semiconductor substrate comprises:
a floating buried doped region of a first conductivity type;
a first doped region of a second conductivity type disposed between the floating buried doped region and the first major surface; and
a semiconductor region of the second conductivity type disposed between the floating buried doped region and the second major surface;
providing a trench isolation structure extending from the first major surface through the first doped region, extending through the floating buried doped region, and extending into the semiconductor region, wherein:
the floating buried doped region adjoins the trench isolation structure; and
the trench isolation structure defines a perimeter for an active region of the semiconductor device structure;
providing an insulated trench structure extending from the first major surface through the first doped region and terminating within the floating buried doped region, wherein:
the insulated trench structure is disposed within the perimeter of the trench isolation structure;
the insulated trench structure defines a first portion, a second portion, and a third portion of the active region; and
the floating buried doped region electrically couples the first portion, the second portion, and the third portion of the active region together;
providing a first semiconductor device disposed within the first portion of the active region and within the first doped region;
providing a first bias semiconductor device disposed within the second portion of the active region and within the first doped region; and
providing a second bias semiconductor device disposed within the third portion of the active region and within the first doped region, wherein the first bias semiconductor device and the second bias semiconductor device are each adapted to set a set a potential of the floating buried doped region.

\* \* \* \* \*